(12) United States Patent
Lim et al.

(10) Patent No.: US 7,635,241 B2
(45) Date of Patent: Dec. 22, 2009

(54) SUPPORT PLATFORM OF NON-CONTACT TRANSFER APPARATUS

(75) Inventors: Tae Hyun Lim, Gumi-si (KR); Hyun Joo Jeon, Daegu-si (KR); Kwang Jong Yoo, Gyeongsangbuk-do (KR); Ji Young Oh, Seoguipo-si (KR); Hyuk Sang Yoon, Busan-si (KR); Yang Sik Moon, Yongin-si (KR)

(73) Assignee: LG Display Co., Ltd., Seoul (KR)

( * ) Notice: Subject to any disclaimer, the term of this patent is extended or adjusted under 35 U.S.C. 154(b) by 556 days.

(21) Appl. No.: 11/454,865

(22) Filed: Jun. 19, 2006

(65) Prior Publication Data

US 2006/0284356 A1    Dec. 21, 2006

(30) Foreign Application Priority Data

Jun. 20, 2005    (KR) .................. 10-2005-0052915

(51) Int. Cl.
 *B65G 53/16*    (2006.01)
(52) U.S. Cl. ........................ 406/88; 198/493
(58) Field of Classification Search ................ 198/493; 414/676; 406/88; 269/21; 248/362; 271/211
 See application file for complete search history.

(56) References Cited

U.S. PATENT DOCUMENTS

| | | | | |
|---|---|---|---|---|
| 2,848,820 A * | 8/1958 | Wallin et al. .................. 34/461 |
| 3,717,381 A * | 2/1973 | Hagler ........................ 406/84 |
| 3,975,057 A * | 8/1976 | Hurd ............................ 406/84 |
| 3,981,546 A * | 9/1976 | Sperman ...................... 384/12 |
| 4,165,132 A * | 8/1979 | Hassan et al. ................. 406/10 |
| 4,275,983 A * | 6/1981 | Bergman ..................... 414/676 |
| 4,299,518 A * | 11/1981 | Whelan ........................ 406/62 |
| 4,556,443 A * | 12/1985 | Moya .......................... 156/356 |
| 5,209,387 A * | 5/1993 | Long et al. .................. 226/97.3 |
| 5,280,465 A * | 1/1994 | Dunbar et al. ............... 369/266 |
| 6,099,056 A * | 8/2000 | Siniaguine et al. ......... 294/64.3 |
| 6,540,001 B1 * | 4/2003 | McNestry .................... 156/541 |
| 6,869,264 B2 * | 3/2005 | Yoo ....................... 414/416.09 |
| 6,899,967 B2 * | 5/2005 | Johnson ....................... 429/19 |
| 7,284,941 B2 * | 10/2007 | Yoo ....................... 414/416.09 |
| 2006/0284042 A1 * | 12/2006 | Ahn et al. |
| 2007/0045499 A1 * | 3/2007 | Kim et al. |

* cited by examiner

*Primary Examiner*—Douglas A Hess
(74) *Attorney, Agent, or Firm*—McKenna Long & Aldridge LLP

(57) ABSTRACT

There is provided a support platform of a non-contact transfer apparatus. The support platform includes a plurality of first holes for introducing air on a surface of the support platform, and a plurality of second holes for removing the air introduced through the first holes. At least one of a size and a number of the first holes varies in a direction from a central portion of the support platform to peripheral portions of the support platform, and the second holes are identically formed to one another.

15 Claims, 13 Drawing Sheets

SUPPORT PLATFORM OF NON-CONTACT TRANSFER APPARATUS

CROSS-REFERENCE TO RELATED PATENT APPLICATION

This application claims the benefit of Korean Patent Application No. 10-2005-0052195, filed on Jun. 20, 2005, which is hereby incorporated by reference for all purposes as if fully set forth herein.

BACKGROUND OF THE INVENTION

1. Field of the Invention

The present invention relates to a support platform of a non-contact transfer apparatus, and more particularly, to a support platform that can transfer objects under a non-contact state.

2. Discussion of the Related Art

Generally, in order to manufacture a semiconductor integrated circuit or a display panel, an object (for example, a substrate) undergoes a plurality of processes. In order to transfer the object from one process to another process, a transfer apparatus is used. A transfer apparatus that can efficiently transfer the object has been studied.

The transfer apparatuses are classified into contact transfer apparatuses that can transfer the object in a state where the object directly contacts a support platform and non-contact transfer apparatuses that can transfer the object in a state where the object is lifted by air pressure. In the case of the contact transfer apparatus, since the object is transferred in a state where it contacts the support platform, the object may be scratched due to friction between the object and the support platform or broken because of contact with the support platform. In the case of the non-contact transfer apparatus, since the object is transferred without contacting the support platform, the damage of the object may be minimized or be prevented and pollution to the object by foreign objects can be lowered. Furthermore, there is no electrostatic problem caused by the contact between the object and the support platform. Because of these apparent benefits, the non-contact transfer apparatus has been more actively studied.

FIG. 1 shows a support platform of a non-contact transfer apparatus according to the related art of the present invention.

In FIG. 1, a prior art support platform 100 of a non-contact transfer apparatus includes a plurality of unit cells each having a chess-table format. The unit cells are provided with a plurality of air intake hole portions 101 and a plurality of air exhaust holes 102. Air is sprayed toward an object 106 through the air intake hole portions 101 and is then exhausted to an external side through the air exhaust holes 102. In this case, intervals between the air intake hole portions 101 are identical to each other. Likewise, intervals between the air exhaust hole 102 are identical to each other. The air intake and exhaust holes 101 and 102 are identical in diameter to each other. Also, pitches between the air intake hole portions 101 and the air exhaust holes 102 are identical to each other.

When the object 106 that may have a size equal to, greater, or less than that of an active surface 107 of the platform 100 is arranged close to and parallel the active surface 107, an air cushion 104 is formed between a bottom surface of the object 106 and the active surface 107. The air cushion 104 provides an intensity of the pressure for uniformly lifting the object 106. The intensity of the pressure depends on an amount of air introduced through the air intake hole portions 101 and an amount of air exhausted through the air exhaust holes 102.

The object 106 may be transferred in the arrow direction in FIG. 1. The air intake hole portions 101 are connected to a pressure storing unit 108 connected to an air pump 109. Therefore, the air sucked by the air pump 109 is stored in the pressure storing unit 108 and is then sprayed through the air intake hole portions 101. The sprayed air forms the air cushion 104 to transfer the object in a state where the object 106 is lifted from the active surface 107 of the platform 100 by a predetermined interval.

In the non-contact transfer apparatus of the related art, because each air intake hole 101 through which the air is introduced has a predetermined diameter, a large amount of air is consumed to form the air cushion 104 on the active surface 107, thereby increasing the process costs.

In addition, since not only the pitches between the holes 101 and 102 but also the diameters of the holes 101 and 102 are identical to each other, as shown in FIG. 2, the pressure at the central portion of the support platform is greater than that at the peripheral portion of the support platform. That is, the pressure distribution is not uniform throughout the active surface of the support platform. Therefore, the object lifted from the platform may jolt or collide with a peripheral object. The jolting or colliding causes damage to the object. Therefore, there is a need to uniformly form air pressure through the active surface of the platform.

SUMMARY OF THE INVENTION

Accordingly, the present invention is directed to a support platform of a non-contact transfer system that substantially obviates one or more problems due to limitations and disadvantages of the related art.

An advantage of the present invention is to provide a support platform of a non-contact transfer apparatus that can dramatically reduce the consumption of air.

Another advantage of the present invention is to provide a support platform of a non-contact transfer apparatus that can stably transfer an object.

Additional advantages and features of the invention will be set forth in the description which follows and in part will become apparent from the description, or may be learned by practice of the invention. These and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a support platform of a non-contact transfer apparatus, including: a plurality of first holes for introducing air on a surface of the platform; and a plurality of second holes for removing the air introduced through the first holes, wherein at least one of a size and a number of the first holes varies in a direction from a central portion of the support platform to peripheral portions of the support platform.

In another aspect of the present invention, there is provided a support platform of a non-contact transfer apparatus, including: a plurality of first pads on which a plurality of first holes are formed; and a plurality of second pads arranged in an alternating pattern with the first pads and each having a plurality of second holes, wherein at least one of a size and a number of the first holes varies in a direction from a central portion of the support platform to peripheral portions of the support platform.

In another aspect of the present invention, there is provided a support platform of a non-contact transfer apparatus, including: a plurality of first holes for introducing air on a surface of the support platform; and a plurality of second holes for removing the air introduced through the first holes, wherein at least one of a size and a number of the second holes varies in a direction from a central portion of the support platform to peripheral portions of the support platform.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention.

In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers will be used throughout the drawings to refer to the same or like parts.

Figure 1:
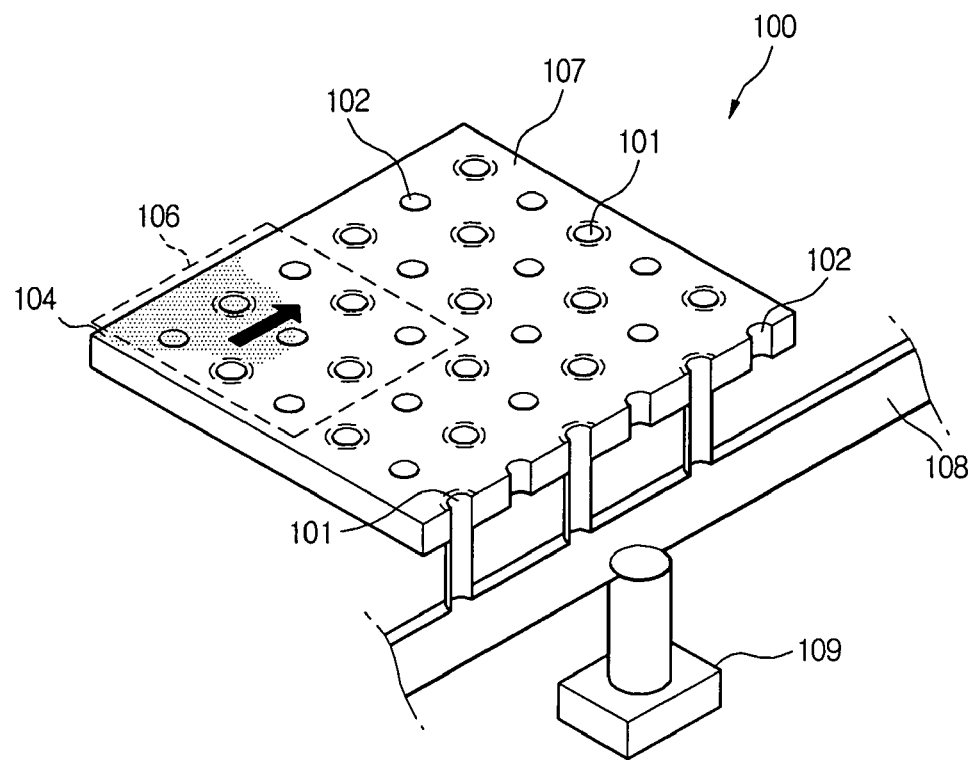
FIG. 1 is a schematic perspective view of a support platform of a non-contact transfer apparatus according to the related art.
Figure 2:
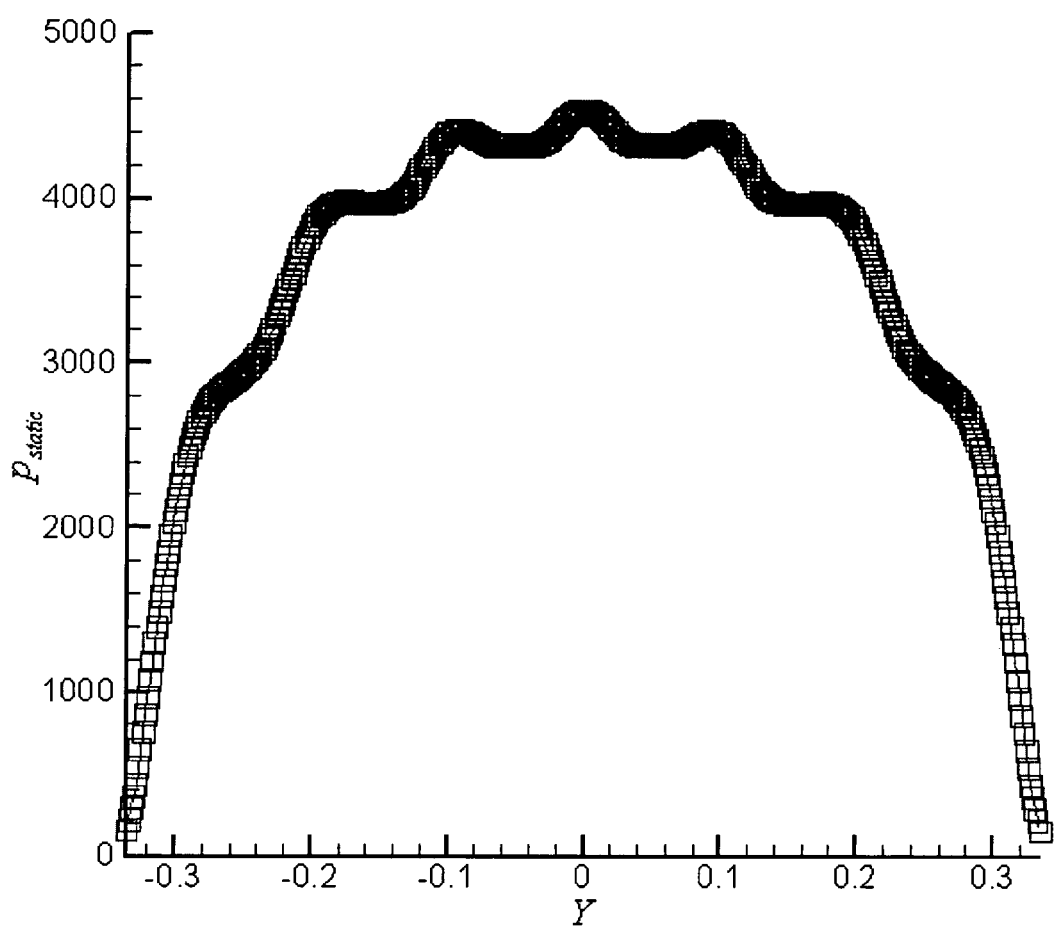
FIG. 2 is a graph illustrating a pressure distribution on the platform of FIG. 1.
Figure 3A:
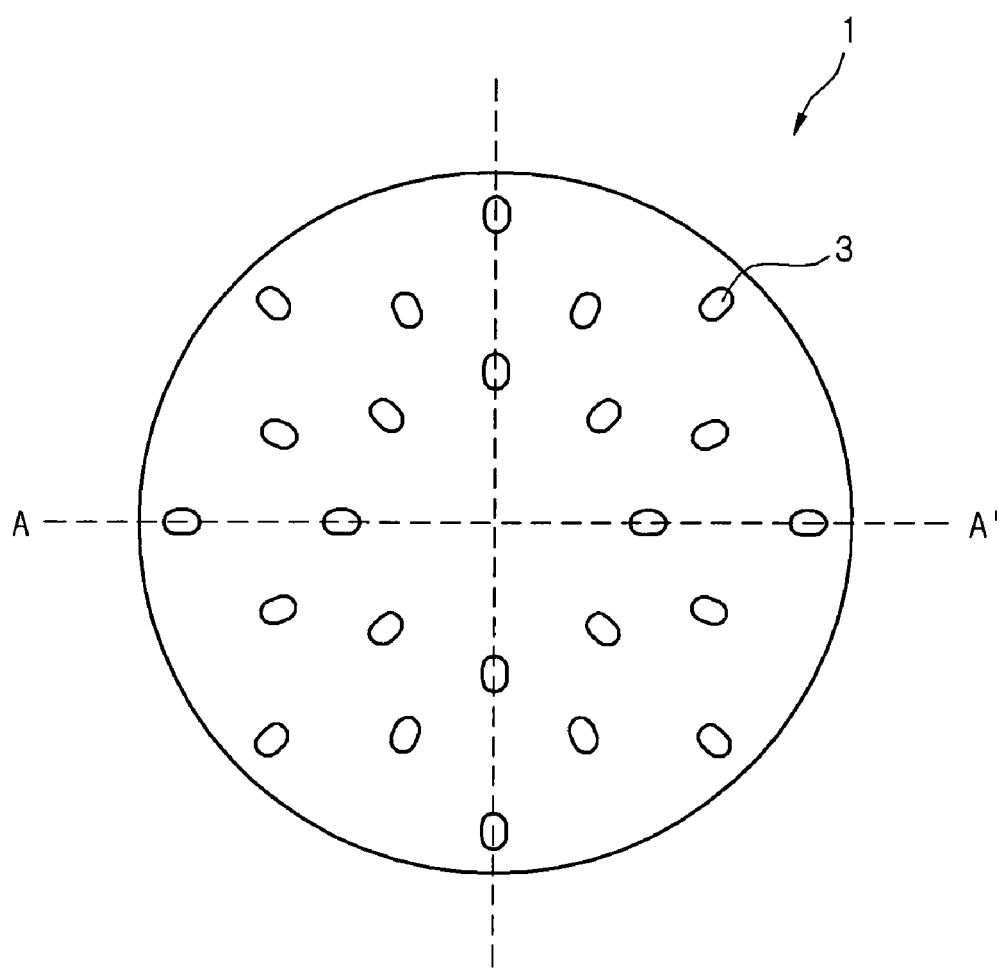
FIG. 3A is a top view illustrating an air intake hole portion of a support platform of a non-contact transfer apparatus of the present invention.
Figure 3B:
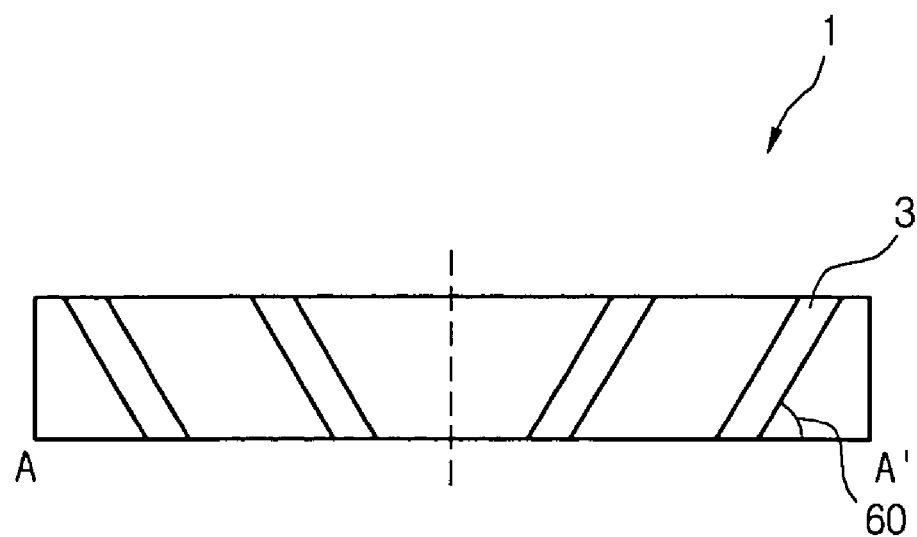
FIG. 3B is a sectional view taken along line A-A' of FIG. 3A.

FIGS. 3A and 3B are respective top and sectional views illustrating an air intake hole portion of a support platform of a non-contact transfer apparatus of the present invention.

In 3A, an air intake hole portion 1 of a support platform includes a plurality of sub-holes 3. The number and locations of the sub-holes 3 formed on a left or lower half of the air intake hole portion 1 are identical to those of the sub-holes 3 formed on a right or upper half of the air intake hole portion 1. That is, the sub-holes 3 are symmetrically formed with reference to a centerline of the air intake hole portion 1. Air is introduced upwardly through the sub-holes 3. The sub-holes 3 may be formed in a rectangular shape, an oval shape, a circular shape, or a polygonal shape.

In FIG. 3B, the sub-holes 3 are inclined at a predetermined angle relative to a bottom surface of the support platform. The inclination of the sub-hole 3 may vary according to a size, shape and weight of an object that will be transferred. For example, the sub-hole 3 may be inclined at about 50-70°, preferably 60°, to the surface of the support platform. At this point, the sub-holes 3 are symmetrically formed and inclined with reference to the centerline of the air intake hole portion 1.

Each sub-hole 3 of the air intake hole portion 1 has a minimum diameter. Therefore, the flow rate of the air passing through the sub-holes 3 increases. Thus, even when a relatively small amount of air is introduced through the sub-holes 3, desired air pressure can be maintained due to the increased flow rate of the air. As a result, the desired air pressure can be realized using the relatively small amount of air, thereby reducing the process costs.

In addition, since the sub-holes are symmetrically formed and inclined with reference to the centerline of the support platform, the air can be uniformly distributed on the support platform.

However, with the above-described structure, although the air pressure around each air intake hole portion 1 is not locally concentrated, the level of the air pressure at the center portion of the support plate is still high as compared with other regions. This problem can be solved by varying pitches between the air intake portions or diameters of the air intake portions. This will now be described in more detail.

In order to uniformly maintain the air pressure, a variety of methods can be used.

That is, a method for allowing an amount of the air introduced through the air intake hole portions at the central portion of the support plate to be greater than that of the air introduced through the air intake hole portions at the peripheral portion of the support plate may be used.

Alternatively, a method for allowing an amount of the air exhausted through air exhaust holes at the peripheral portion of the support platform to be less than an amount of the air exhausted through air exhaust holes at the central portion of the support platform may be used.

Both the above methods allow the air pressure to increase at the peripheral portion of the support platform and to decrease at the central portion of the support platform, thereby realizing a uniform pressure distribution throughout the overall surface of the support platform.

In the following description of a variety of embodiments, FIGS. 4 through 7 show embodiments where the uniform pressure distribution on the support platform is realized by controlling the air intake hole portions while FIGS. 8 through 11 show embodiments where the uniform pressure distribution on the support platform is realized by controlling the air exhaust hole portions.

Figure 4:
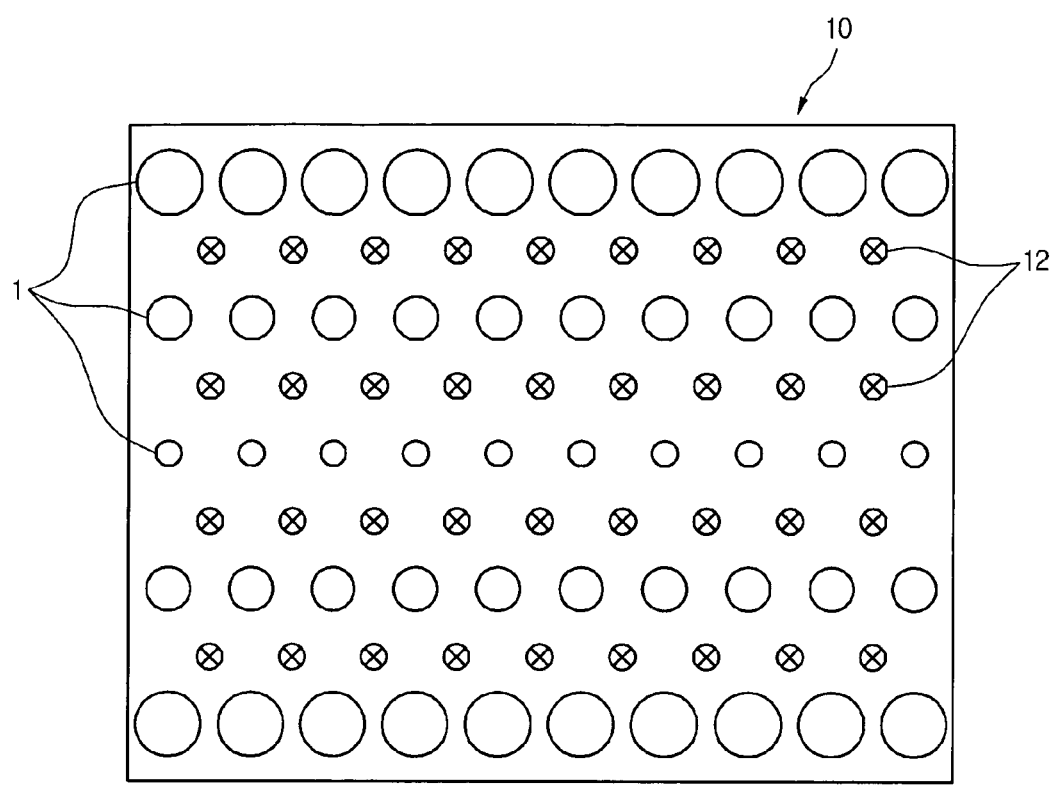
FIG. 4 is a top view of a support platform of a non-contact transfer apparatus according to a first embodiment of the present invention.

FIG. 4 is a top view of a support platform of a non-contact transfer apparatus according to a first embodiment of the present invention.

As shown in FIG. 4, a support platform includes a guide pad 10 on which a plurality of air intake hole portions 1 are formed along a plurality of lines. A plurality of sub-holes (3 of FIG. 3A) are formed through each air intake hole portion 1. A plurality of air exhaust holes 12 are formed along lines between the lines along which the air intake hole portions 1 are formed. That is, the lines on which the air intake hole portions 1 are formed alternate with the lines on which the air exhaust holes 12 are formed.

Air is introduced upwardly through the air intake hole portions 1 to transfer an object in a state where the object is lifted from the surface of the guide pad 10. Then, the air is exhausted downwardly through the air exhaust holes 12.

In order to stably transfer the object under the uniform air pressure, diameters of the air intake hole portions 1 increase toward peripheral portions of the guide pad 10. In this embodiment, a number of sub-holes formed on each intake hole portion 1 at the central portion of the guide pad 10 is greater than a number of sub-holes formed on each intake hole portion 1 at the peripheral portions of the guide pad 10.

Therefore, an amount of the air introduced through the air intake hole portions 1 increases as it goes from the central portion toward the peripheral portions of the guide pad 10. Thus, the air pressure increases at the peripheral portions of the guide pad 10 to provide a uniform air pressure distribution on the guide pad 10. As a result, the object can be stably transferred by an air cushion having uniform air pressure distribution.

Unlike the guide pad 10 of FIG. 4, a guide pad on which the air intake hole portions 1 and the air exhaust holes 12 are formed in a chess-table format may be provided.

According to this embodiment, since an amount of the air introduced through the central portion of the support platform is less than that of the air introduced through the peripheral portions of the support platform, the uniform air pressure distribution can be realized on the support platform, thereby stably transferring the object.

In addition, since the diameters of the sub-holes are relatively small, the flow rate of the air increases. This enables the reduction of the amount of air to be consumed, thereby reducing process costs.

Figure 5:
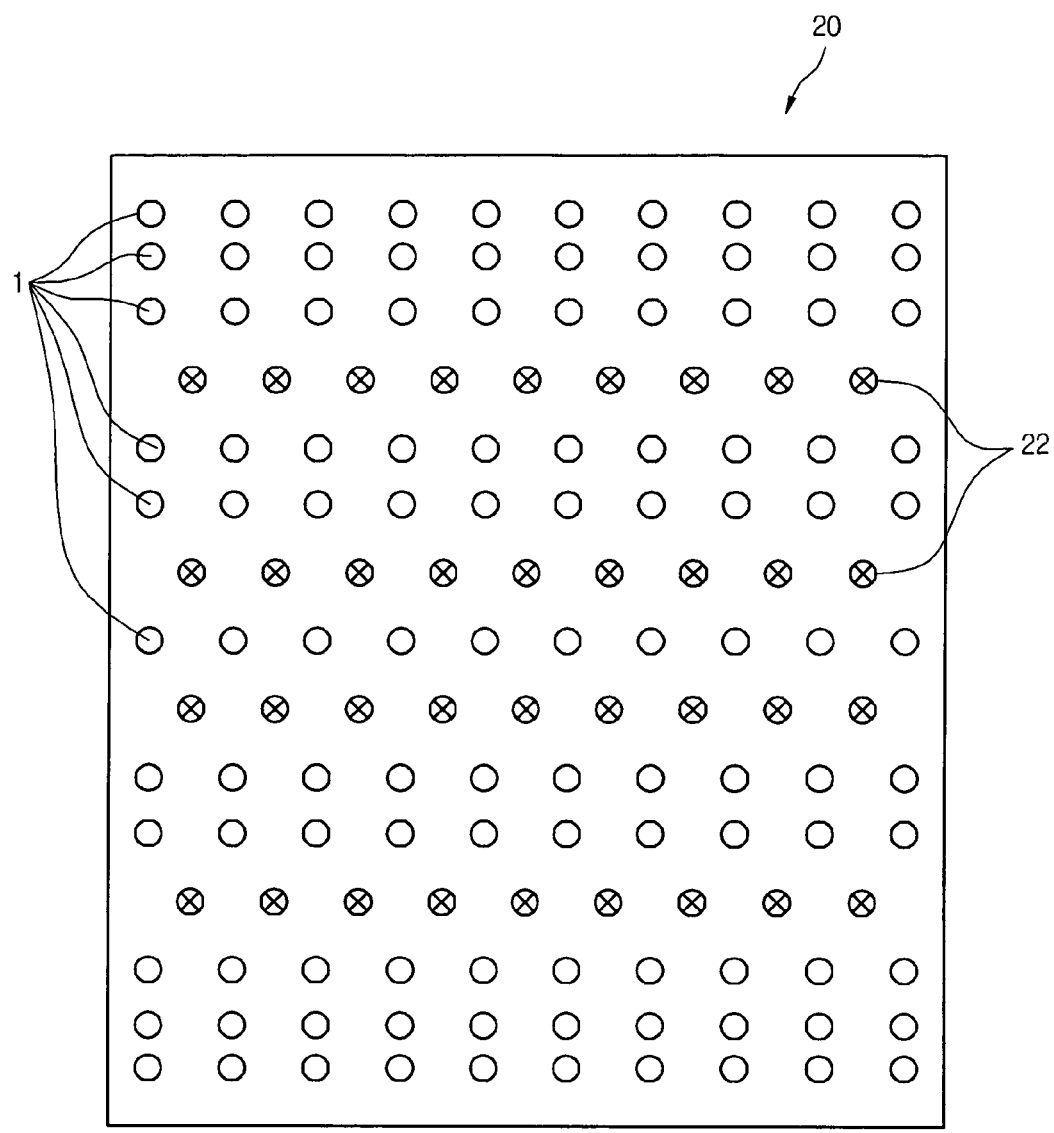
FIG. 5 is a top view of a support platform of a non-contact transfer apparatus according to a second embodiment of the present invention.

FIG. 5 is a top view of a support platform of a non-contact transfer apparatus according to a second embodiment of the present invention.

In FIG. 5, diameters of air intake hole portions 1 and air exhaust holes 22 are identical to each other. However, intervals between the air exhaust holes 22 are identical to each other, while intervals between the air intake hole portions 1 are reduced in a direction from the central portion of a guide pad 20 toward peripheral portions of the guide pad 20. That is, the number of air intake hole portions 1 increases in a direction from the central portion to the peripheral portions. As described above, because the number of air intake hole portions 1 at the peripheral portions of the guide pad 20 is greater than that of air intake hole portions 1 at the central portion of the guide pad 20, an amount of the air introduced through the central portion of the guide pad 20 is greater than that of the air introduced through the peripheral portions of the guide pad 20.

For example, at the central portion of the guide pad 20, the air intake hole portions 1 are formed along only one line. However, at each periphery portion, the air intake hole portions 1 are formed along three lines. In addition, at each portion between the central portion and each peripheral portion, the air intake hole portions 1 are formed along two lines.

As the number of air intake hole portions 1 at the peripheral portions of the guide pad 20 is greater than that of air intake hole portions at the central portion of the guide pad 20, an amount of the air introduced through the central portion of the support platform is less than that of the air introduced through the peripheral portions of the guide pad. Therefore, the uniform air pressure distribution can be realized on the guide pad 20 of the support platform, thereby stably transferring the object.

Figure 6:
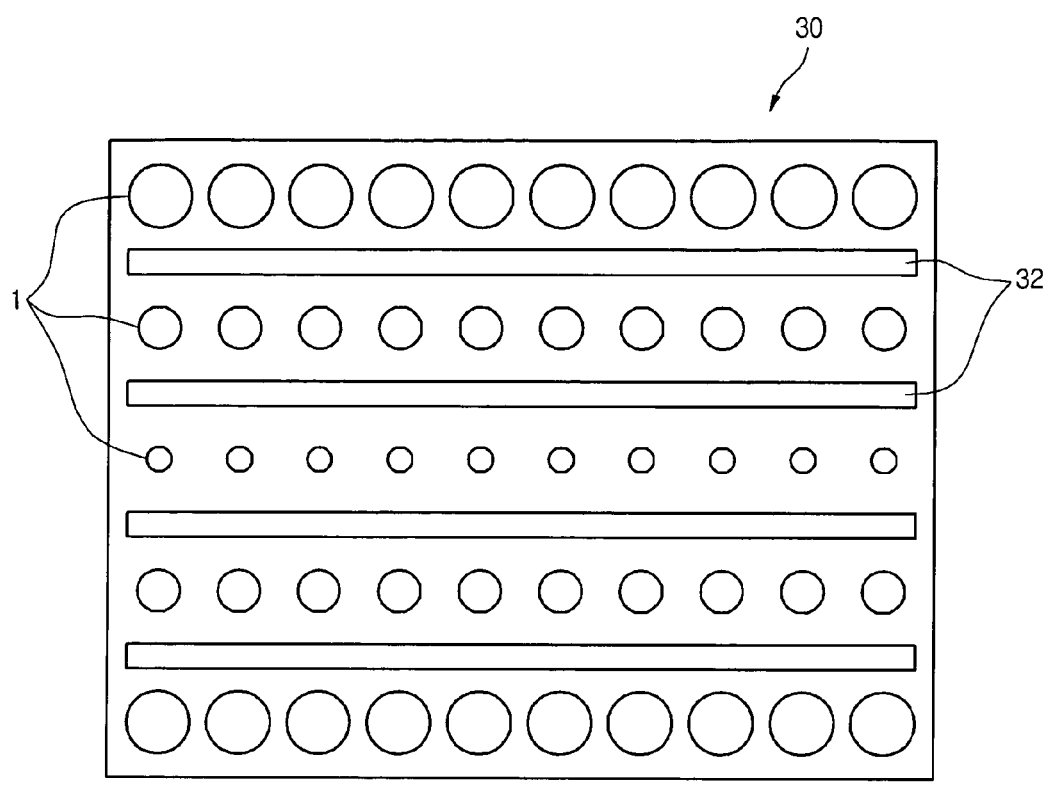
FIG. 6 is a top view of a support platform of a non-contact transfer apparatus according to a third embodiment of the present invention.

FIG. 6 is a top view of a support platform of a non-contact transfer apparatus according to a third embodiment of the present invention.

In FIG. 6, diameters of air intake hole portions 1 increase in a direction from a central portion to peripheral portions of a guide pad 30. A substantially rectangular slot 32 is formed at each line between the lines in which the air intake hole portions 1 are formed. The substantially rectangular slots 32 function as the air exhaust holes 12 of FIG. 4. Air is introduced through the substantially air intake hole portions 1 and exhausted through the rectangular slots 32, in the course of which an air cushion having a uniform thickness is formed to lift and transfer the object.

The substantially rectangular slots 32 allow the air to be more effectively exhausted. Therefore, this third embodiment may be applied when a more effective air exhaust is required.

Figure 7:
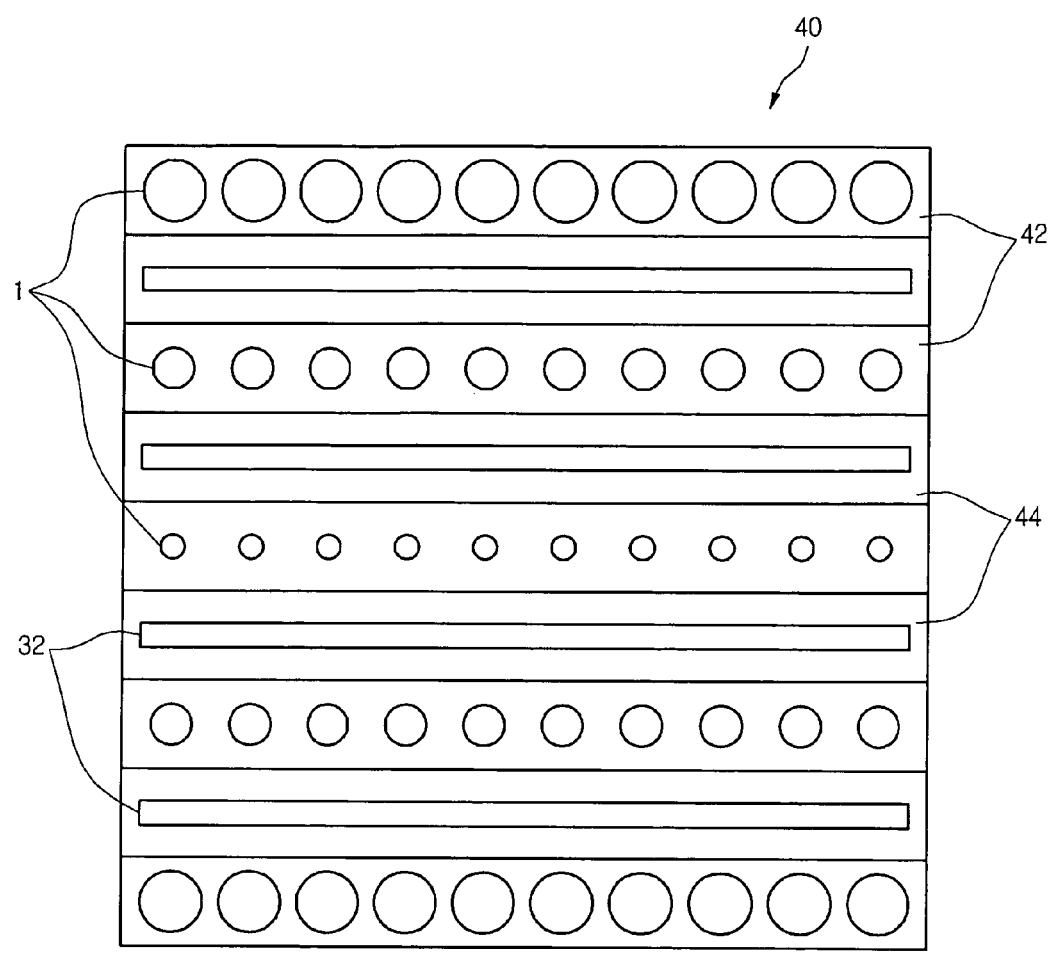
FIG. 7 is a top view of a support platform of a non-contact transfer apparatus according to a fourth embodiment of the present invention.

FIG. 7 is a top view of a support platform of a non-contact transfer apparatus according to a fourth embodiment of the present invention.

In FIG. 7, a support platform includes a guide pad 40 having a plurality of air pads 42 on each of which a plurality of air intake hole portions 1 are formed and a plurality of dummy pads 44 on each of which a plurality of exhaust holes (not shown) or a substantially rectangular slot 32 is formed. The air pads 42 and the dummy pads 44 are alternately arranged and connected to each other. The air and dummy pads 42 and 44 may be formed of an identical material or different materials. One line of air intake hole portions is formed along each air pad 42 and one line of air exhaust holes or rectangular slot 32 is formed on each dummy pad 44. In this embodiment, the substantially rectangular slots 32 formed on the dummy pads 44 are identical in a size to each other. However, diameters of the air intake hole portions 1 formed on the air pads 42 increase in a direction from a central portion of the guide pad 40 to peripheral portions of the guide pad 40.

The air pads 42 and the dummy pads 44 may be coupled to each other by, for examples, screws or adhesive.

According to this embodiment, because an amount of the air introduced through the central portion of the support platform is less than that of the air introduced through the peripheral portions of the support platform, the uniform air pressure distribution can be realized on the support platform, thereby stably transferring the object.

Furthermore, since the guide pad 40 is formed by combining the plurality of the air pads 42 with the dummy pads 44, it becomes possible to realize a large-sized support platform that can transfer a large-sized object.

Figure 8:
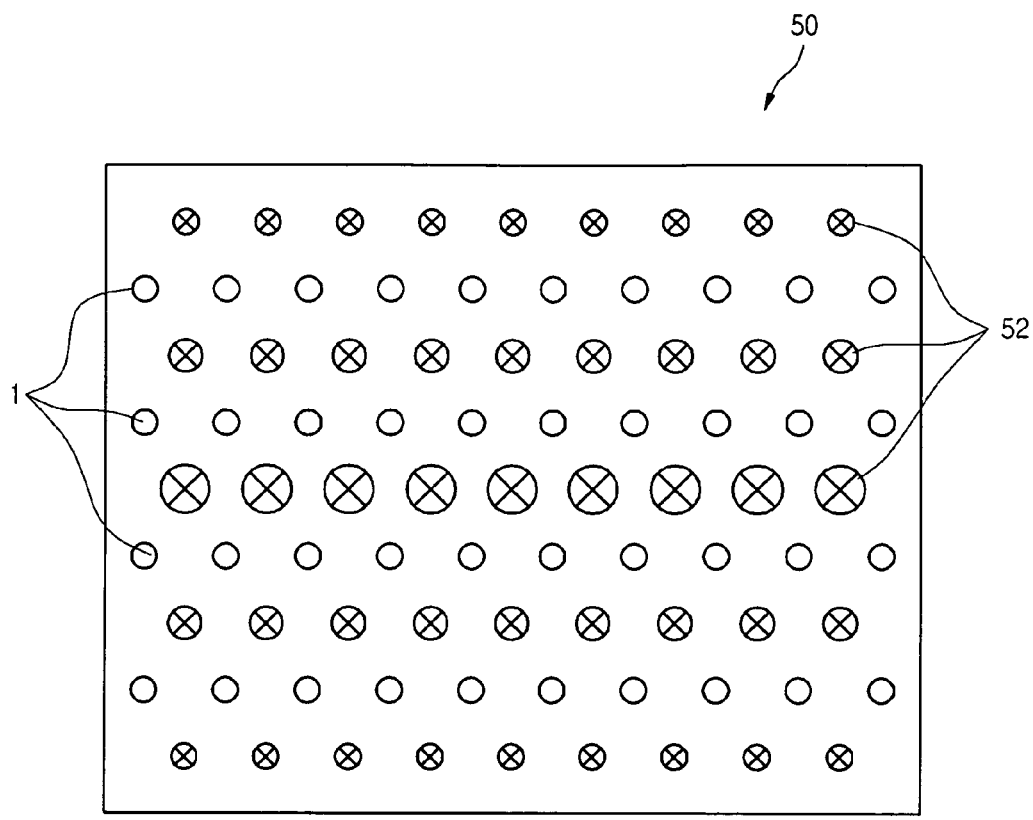
FIG. 8 is a top view of a support platform of a non-contact transfer apparatus according to an fifth embodiment of the present invention.

FIG. 8 is a top view of a support platform of a non-contact transfer apparatus according to an fifth embodiment of the present invention.

As shown in FIG. 8, a support platform of this embodiment includes a guide pad 50 on which a plurality of air intake hole portions 1 are formed along a plurality of lines. A plurality of sub-holes (3 of FIG. 3A) are formed through each air intake hole portion 1. A plurality of air exhaust holes 52 are formed along lines between the lines along which the air intake hole portions 1 are formed. That is, the lines on which the air intake hole portions 1 are formed in an alternating pattern with the lines on which the air exhaust holes 12 are formed. The diameters of the air intake hole portions 1 are identical to each other. The intervals between the air intake hole portions 1 are also identical to each other. However, diameters of the air exhaust holes 52 increase in a direction from peripheral portions of the guide pad 50 to a central portion of the guide pad 50. Therefore, an amount of the air exhausted through the air exhaust holes 52 at the central portion of the guide pad 50 is greater that that of the air exhausted through the air exhaust holes 52 at the peripheral portions of the guide pad 50. Therefore, the air pressure at the central portion is reduced, while the air pressure at the peripheral portions is not varied, thereby providing a uniform air pressure distribution on the guide pad 10. As a result, the object can be stably transferred by an air cushion having uniform air pressure distribution.

Figure 9:
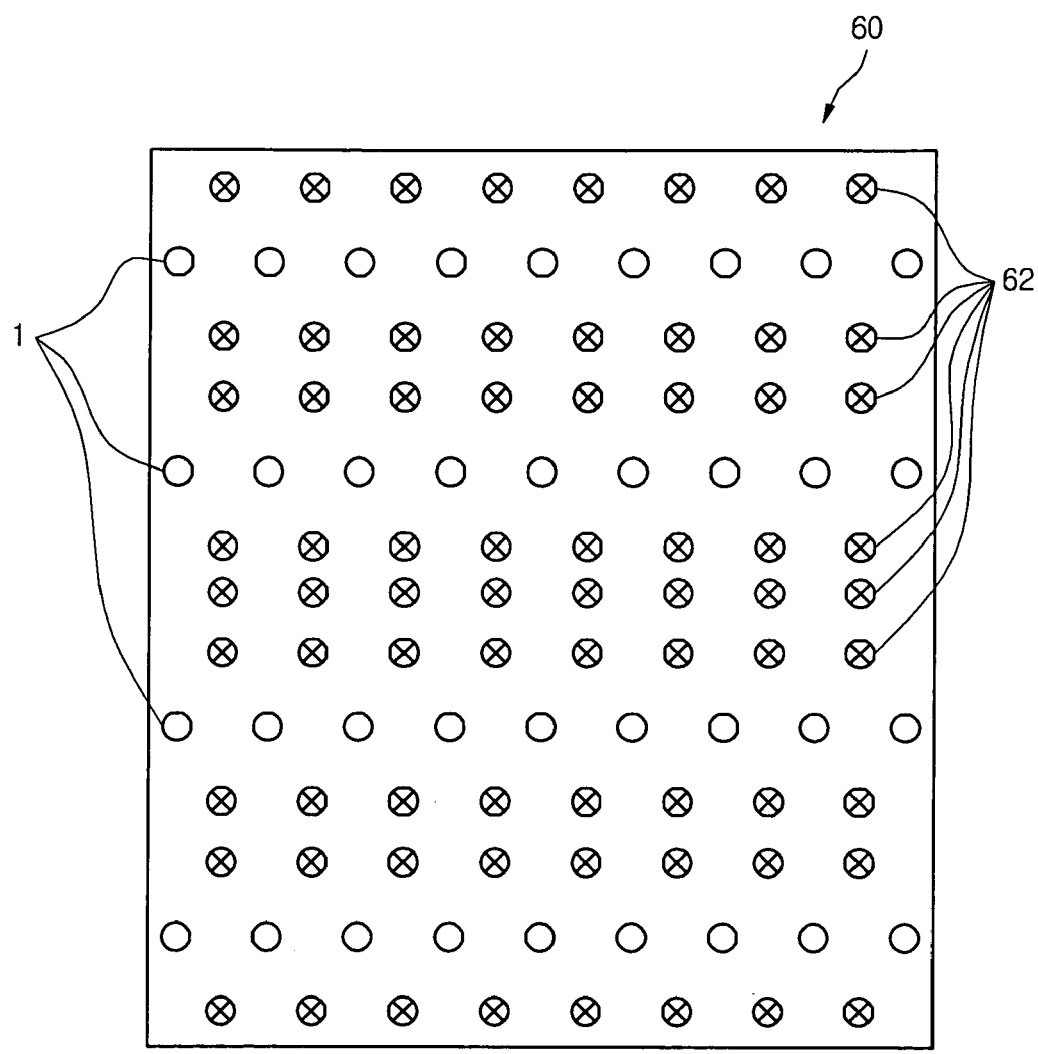
FIG. 9 is a top view of a support platform of a non-contact transfer apparatus according to a sixth embodiment of the present invention.

FIG. 9 is a top view of a support platform of a non-contact transfer apparatus according to a sixth embodiment of the present invention.

In FIG. 9, a support platform of this embodiment is similar to that of the fifth embodiment. However, a number of air exhaust holes 62 decreases in a direction from the central portion to the peripheral portions. For example, at each periphery portion of a guide pad 60, the air exhaust holes 62 are formed along only one line. However, at a central portion of the guide pad 60, the air exhaust holes 62 are formed along three lines. As the number of air exhaust holes 62 at the periphery portions of the guide pad 60 is less than that of air exhaust holes 62 at the central portion of the guide pad 60, an amount of the air exhausted through the central portion of the guide pad 60 is greater than that of the air introduced through the peripheral portions of the guide pad. Therefore, uniform air pressure distribution can be realized on the guide pad 60 of the support platform, thereby stably transferring the object.

Figure 10:
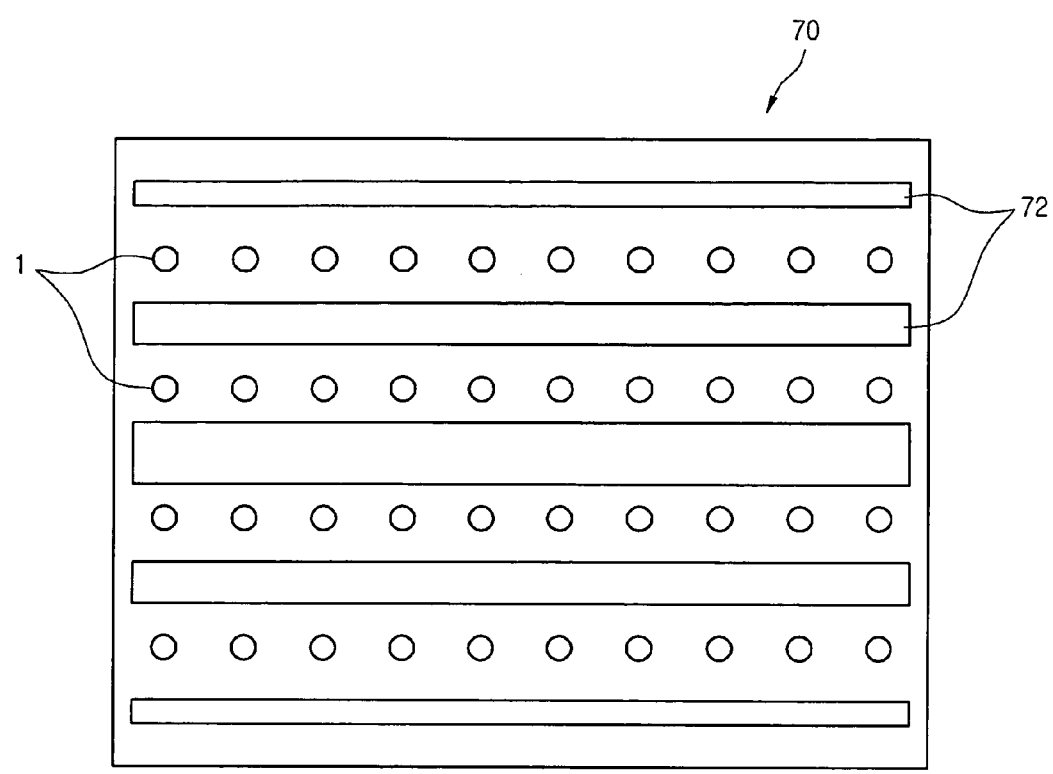
FIG. 10 is a top view of a support platform of a non-contact transfer apparatus according to a seventh embodiment of the present invention.

FIG. 10 is a top view of a support platform of a non-contact transfer apparatus according to a seventh embodiment of the present invention.

In FIG. 10, a support platform includes a guide pad 70 on which a plurality of air intake hole portions 1 are formed along lines. A plurality of sub-holes are formed through each air intake hole portions 1. Substantially rectangular slots 72 are formed on the guide pad 70 along each line between the lines in which the air intake hole portions 1 are formed. The substantially rectangular slots 72 exhaust air to form an air cushion having a uniform thickness on the guide pad 70. Areas of the rectangular slots 72 increase in an area from peripheral portions of the guide pad 70 to a central portion of the guide pad 70. Therefore, an amount of air exhausted through the substantially rectangular slot 72 at the central portion of the guide pad 70 is greater than that of air exhausted through the substantially rectangular slot 72 at the periphery portions of the guide pad 70, thereby reducing the air pressure at the central portion. As a result, a uniform air pressure distribution is maintained on the guide pad 70.

Figure 11:
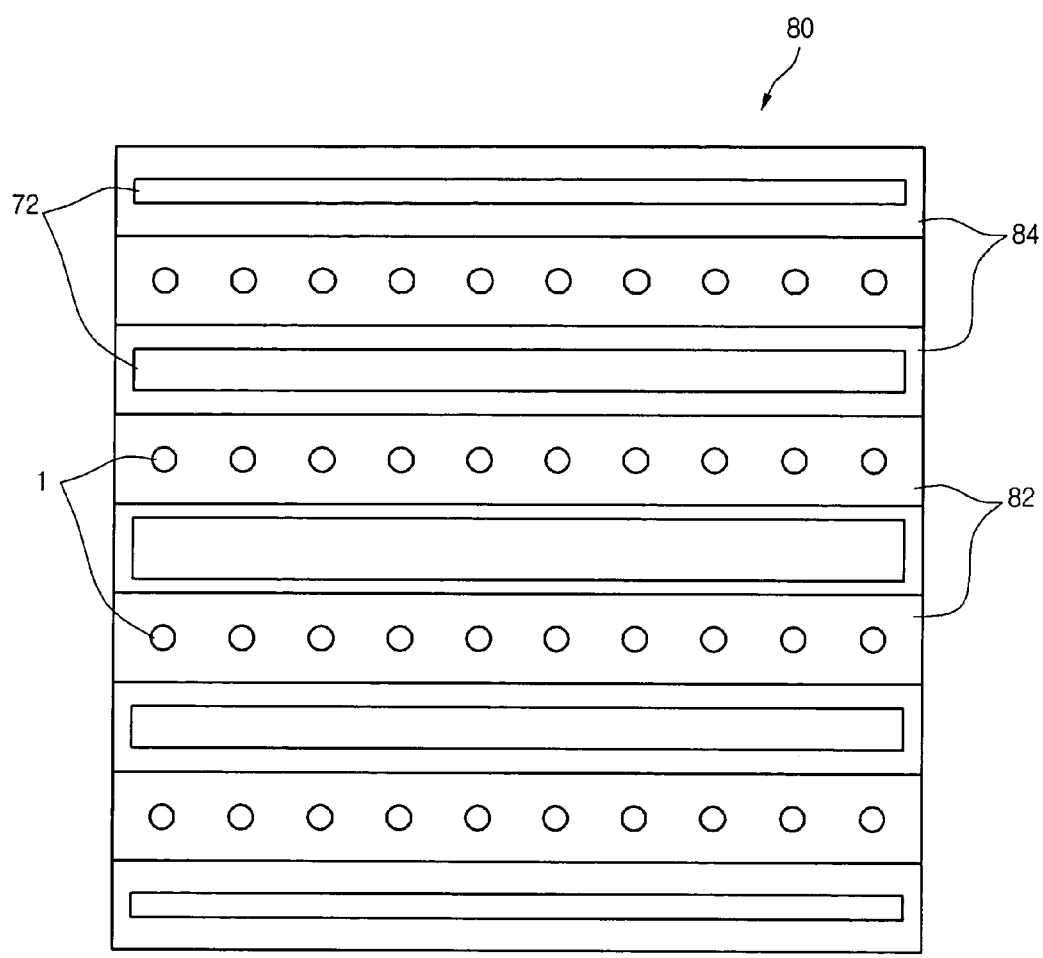
FIG. 11 is a top view of a support platform of a non-contact transfer apparatus according to an eighth embodiment of the present invention.

FIG. 11 is a top view of a support platform of a non-contact transfer apparatus according to an eighth embodiment of the present invention.

In FIG. 11, a support platform includes a guide pad 80 having a plurality of air pads 82 on each of which a plurality of air intake hole portions 1 are formed and a plurality of dummy pads 84 on each of which a plurality of exhaust holes (not shown) or a rectangular slot 72 is formed. The air pads 82 and the dummy pads 84 are alternately connected to each other. The air and dummy pads 82 and 84 may be formed of an identical material or different materials. One line of air intake hole portions is formed along each air pad 82 and one line of air exhaust holes or rectangular slot 72 is formed on each dummy pad 84.

In this embodiment, sizes of the air intake hole portions 1 formed on the air pads 82 are identical to each other. However, sizes of the substantially rectangular slot holes 72 formed on the dummy pads 84 increase in a direction from peripheral portions of the guide pad 80 to a central portion of the guide pad 80.

The air pads 82 and the dummy pads 84 may be coupled to each other by, for example, screws or adhesive.

According to this embodiment, since an amount of the air exhausted through the substantially rectangular slots 72 at the center portion of the support platform is greater than that of the air exhausted through the peripheral portions of the support platform, uniform air pressure distribution can be realized on the support platform, thereby stably transferring the object.

Furthermore, since the guide pad 80 is formed by combining the plurality of the air pads 82 with the plurality of the dummy pads 84, it becomes possible to realize a large-sized support platform that can transfer a large-sized object.

Figure 12:
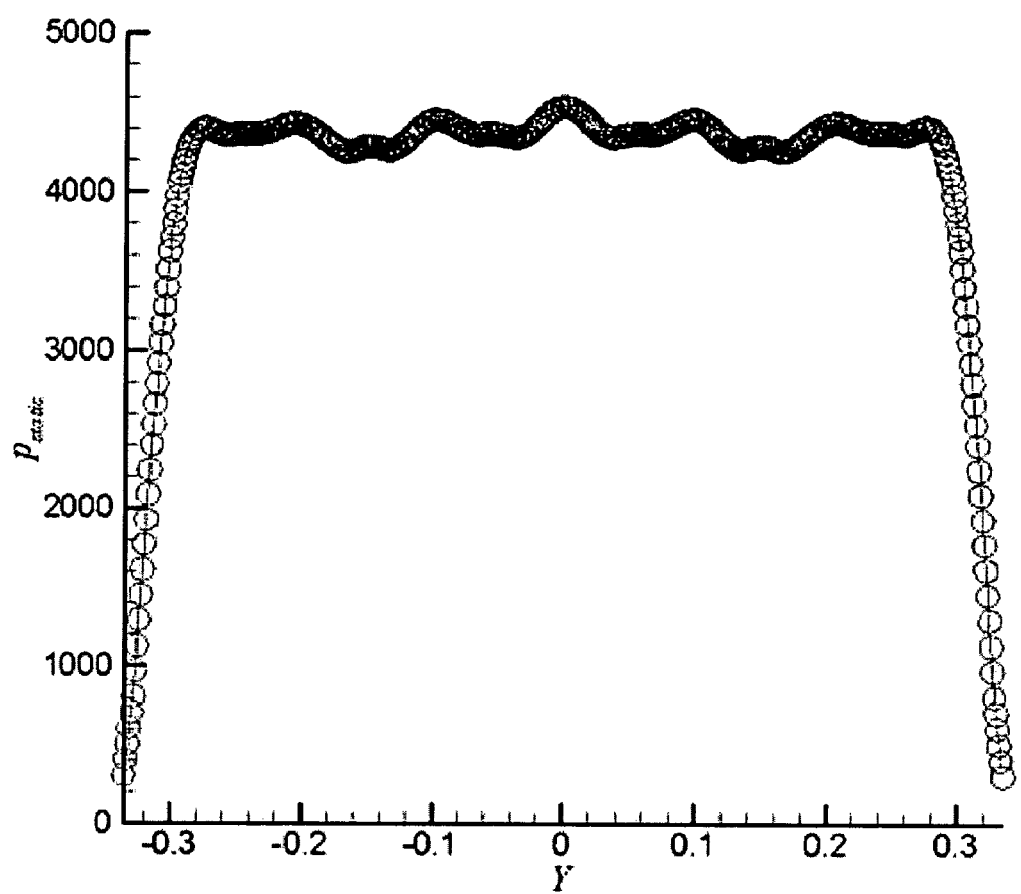
FIG. 12 is a view illustrating an air pressure distribution on the support platform of the present invention.

FIG. 12 is a view illustrating an air pressure distribution on the support platform of the present invention.

As shown in FIG. 12, it can be noted that air pressure is more uniformly distributed throughout the support platform according to the first to eighth embodiments of the present invention. With the uniform air pressure distribution on the support platform, an object can be stably transferred by the air cushion.

According to the present invention, since a plurality of sub-holes are formed on each air exhaust hole portion and inclined at a predetermined angle, the consumption of the air can be reduced and the object can be stably transferred.

In addition, by varying the air intake hole portions and the exhaust holes, the air pressure can be uniformly distributed on the support platform, thereby stably transferring the object.

Furthermore, since the guide pad can be formed by combining the plurality of the air pads with the plurality of the dummy pads, it becomes possible to realize a larger-sized support platform that can transfer a larger-sized object.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A support platform of a non-contact transfer apparatus, comprising:
    a plurality of first holes for introducing air on a surface of the platform, each first hole having a plurality of sub-holes symmetrically and radially arranged along a direction from a center portion of each first hole to an edge portion of each first hole; and
    a plurality of second holes for removing the air introduced through the first holes,
    wherein at least one of a size of each first hole and the number of the first holes varies in a direction from a central portion of the support platform to peripheral portions of the support platform.

2. The support platform according to claim 1, wherein the size of the first holes enlarges in a direction from the central portion to the peripheral portions of the support platform.

3. The support platform according to claim 1, wherein the number of first holes increases in a direction from the central portion to the peripheral portions of the support platform.

4. The support platform according to claim 1, wherein the sub-holes are formed through the first holes at a predetermined inclination angle with respect to a bottom surface of the first holes.

5. A support platform of a non-contact transfer apparatus, comprising:
- a plurality of first pads on which a plurality of first holes are formed, each first hole having a plurality of sub-holes symmetrically and radially arranged along a direction from a center portion of each first hole to an edge portion of each first hole; and
- a plurality of second pads arranged in an alternating pattern with the first pads and each having a plurality of second holes,
- wherein at least one of a size of each first hole and the number of the first holes varies in a direction from a central portion of the support platform to peripheral portions of the support platform, and
- wherein the first pads are connected to the second pads in the same plane.

6. The support platform according to claim 5, wherein the size of the first holes enlarges in a direction from the central portion to the peripheral portions of the support platform.

7. The support platform according to claim 5, wherein the number of the first holes on the first pads increases in a direction from the central portion to the peripheral portions of the support platform.

8. A support platform of a non-contact transfer apparatus, comprising:
- a plurality of first holes for introducing air on a surface of the support platform, each first hole having a plurality of sub-holes symmetrically and radially arranged along a direction from a center portion of each first hole to an edge portion of each first hole; and
- a plurality of second holes for removing the air introduced through the first holes,
- wherein at least one of a size of each second hole and the number of the second holes varies in a direction from a central portion of the support platform to peripheral portions of the support platform.

9. The support platform according to claim 8, the second holes are formed in any one of a circular shape and a substantially rectangular shape.

10. The support platform according to claim 9, wherein the size of the second holes enlarge in a direction from the peripheral portions to the central portion of the support platform.

11. The support platform according to claim 9, wherein the number of the second holes increases in a direction from the peripheral portions to the central portion of the support platform.

12. support platform according to claim 9, wherein the sub-holes are formed through the first holes at a predetermined inclination angle with respect to a bottom surface of the first holes.

13. A support platform of a non-contact transfer apparatus, comprising:
- a plurality of first pads on which a plurality of first holes are formed, each first hole having a plurality of sub-holes symmetrically and radially arranged along a direction from a center portion of each first hole to an edge portion of each first hole; and
- a plurality of second pads arranged in an alternating pattern with the first pads each having a plurality of second holes,
- wherein at least one of a size of each second hole and the number of the second holes varies in a direction from a central portion of the support platform to peripheral portions of the support platform, and
- wherein the first pads are connected to the second pads in the same plane.

14. support platform according to claim 13, wherein the size of the second holes on the second pads enlarges in a direction from the peripheral portions to the central portion of the support platform.

15. The support platform according to claim 13, wherein the number of the second holes on the second pads increases in a direction from the peripheral portions to the central portion in the support platform.

* * * * *

UNITED STATES PATENT AND TRADEMARK OFFICE
CERTIFICATE OF CORRECTION

| | | |
|---|---|---|
| PATENT NO. | : 7,635,241 B2 | Page 1 of 1 |
| APPLICATION NO. | : 11/454865 | |
| DATED | : December 22, 2009 | |
| INVENTOR(S) | : Tae Hyun Lim | |

It is certified that error appears in the above-identified patent and that said Letters Patent is hereby corrected as shown below:

Title page, item [73] Assignee: should read as follows:

LG Display Co., Ltd.
AVACO Co., Ltd.
LG Electronics, Inc.

Signed and Sealed this
Twenty-fifth Day of October, 2011

David J. Kappos
*Director of the United States Patent and Trademark Office*